United States Patent
Shanmugasundram et al.

(10) Patent No.: US 6,648,588 B2
(45) Date of Patent: Nov. 18, 2003

(54) MULTIPLE SIDED ROBOT BLADE FOR SEMICONDUCTOR PROCESSING EQUIPMENT

(75) Inventors: Arul Shanmugasundram, Milpitas, CA (US); Michael P. Karazim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/273,071

(22) Filed: Oct. 17, 2002

(65) Prior Publication Data

US 2003/0053903 A1 Mar. 20, 2003

Related U.S. Application Data (62) Division of application No. 09/398,317, filed on Sep. 16, 1999, now Pat. No. 6,481,951.

(51) Int. Cl.[7] .................................................. B65H 5/00
(52) U.S. Cl. ....................... 414/806; 414/808; 294/64.1
(58) Field of Search ........................... 414/744.5, 744.3, 414/806, 808; 901/40, 16; 294/64.1, 64.3

(56) References Cited

U.S. PATENT DOCUMENTS 5,093,978 A * 3/1992 Binder ..................... 901/16 X
5,125,790 A 6/1992 Foulke et al. ................ 414/752
5,460,478 A 10/1995 Akimoto et al. ............. 414/786
5,664,925 A 9/1997 Muka et al. ................. 414/217
5,738,574 A 4/1998 Tolles et al. ................ 451/288
5,759,006 A * 6/1998 Miyamoto et al. ....... 414/217 X
5,764,013 A 6/1998 Yae ........................ 318/568.11
5,789,878 A 8/1998 Kroeker et al. ............... 318/45
5,907,895 A 6/1999 Yu et al. .................... 29/281.5
5,967,578 A * 10/1999 Frey ....................... 901/40 X
6,071,055 A 6/2000 Tepman ...................... 414/217

* cited by examiner

Primary Examiner—Donald W. Underwood
(74) Attorney, Agent, or Firm—Moser, Patterson & Sheridan, L.L.P.

(57) ABSTRACT

The present invention generally provides a processing system having a robot assembly which includes a multiple sided robot blade that can support a substrate on at least two sides thereof and associated methods to transfer one or more substrates in a processing system. An unprocessed substrate can be supported on the blade while a processed substrate is retrieved from a location to which the unprocessed substrate is to be delivered. The processing throughput rate is increased by reducing the movements required by the robot to exchange processed substrates and unprocessed substrates, thus decreasing the swap time.

14 Claims, 10 Drawing Sheets

MULTIPLE SIDED ROBOT BLADE FOR SEMICONDUCTOR PROCESSING EQUIPMENT

CROSS-REFERENCE TO RELATED APPLICATIONS

This application is a divisional of U.S. patent application Ser. No. 09/398,317, filed Sep. 16, 1999, now U.S. Pat. No. 6,481,951, which is herein incorporated by reference.

BACKGROUND OF THE INVENTION

1. Field of the Invention

The present invention relates to an apparatus and method for transferring objects in a processing system. More specifically, the present invention relates to a robot assembly having a multiple sided robot blade which can support one or more substrates.

2. Background of the Related Art

Modern semiconductor processing systems typically process a large number of substrates by moving the substrates between a series of process chambers or enclosures using a robot. To increase the throughput rates of substrates, the trend is to increase the speeds at which substrates are moved in the system. However, increased speeds add complexity to the substrate handling systems. Increased speeds have decreased the allowable tolerances necessary to maintain repeatability because precise movement is needed to avoid damaging the substrate or the films formed thereon as the substrate is moved between the process chambers or enclosures using the robot.

Figure 1:
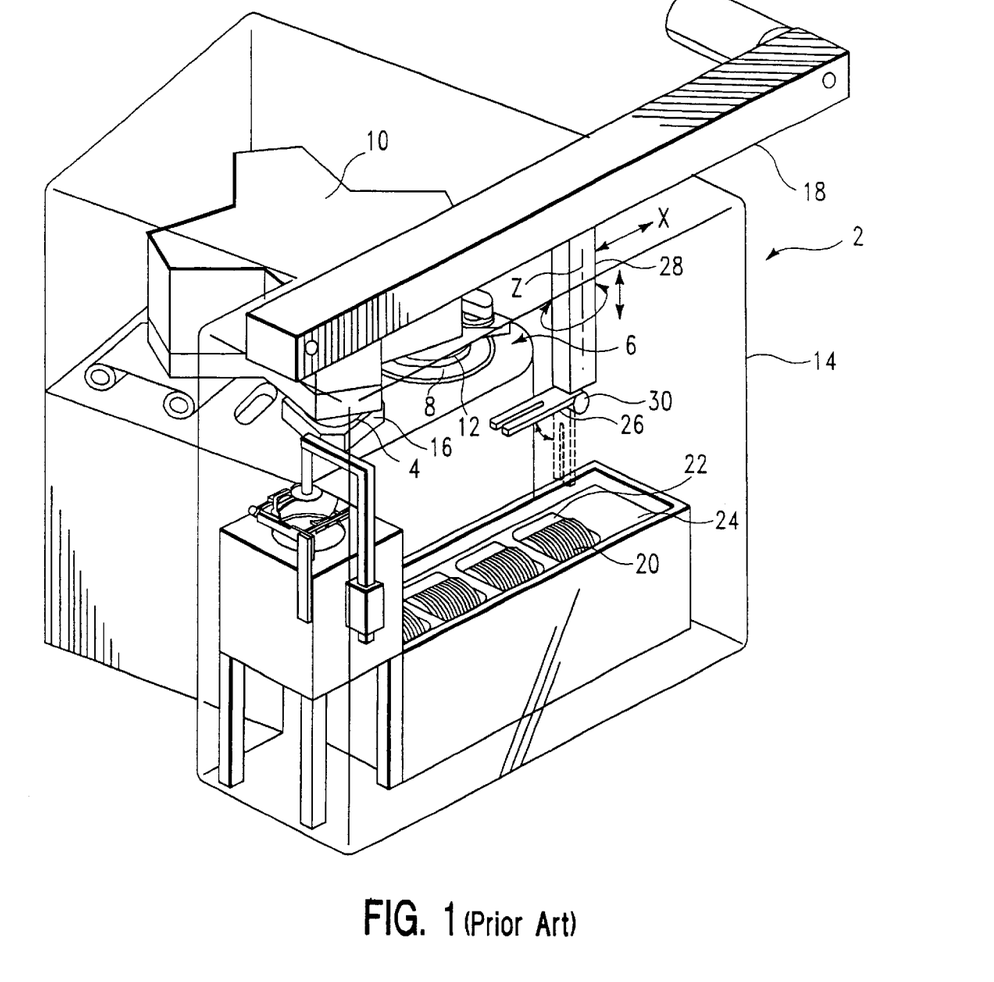
FIG. 1 is a schematic perspective view of a typical processing system.

One type of system used in substrate processing is a chemical mechanical polishing (CMP) system used to polish a substrate surface to remove high topography, surface defects, scratches, or embedded particles. FIG. 1 is a schematic perspective view of one CMP system known as a Mirra® CMP system available from Applied Materials, Inc. of Santa Clara, Calif., which is shown and described in U.S. Pat. No. 5,738,574, incorporated herein by reference. The system 2 includes a loading station 4 and three polishing stations 6 having polishing and/or rinsing pads 8 disposed therein. A rotatable multi-head carousel 10 having four polishing heads 12 is mounted above the stations and indexes the heads from station to station. The loading station 4 is supplied by a front-end substrate transfer region 14 disposed adjacent to the CMP system and is considered a part of the CMP system, although the transfer region 14 may be a separate component. The loading station 4 includes a pedestal 16 on which a substrate is supported following delivery by an overhead track robot 18 prior to and after processing in the polishing stations 6. Vertically aligned substrate(s) 20 are held in cassette(s) 22 disposed in a fluid in a load tank 24.

Generally, an overhead track robot 18 includes a downwardly extending blade support arm 28, also known as a shoulder. A blade 26 is attached to the blade support arm at a pivot joint 30, typically referred to as a wrist. The track robot 18 is capable of operating the blade support arm in three directions: in a linear direction along an X-axis across the front of the system, in a vertical direction along a Z-axis, and in a rotational direction about the Z-axis. Additionally, the blade 26 is capable of rotating about pivot joint 30 between a substantially horizontal position and a substantially vertical position. The blade 26 typically includes a vacuum port (not shown) for holding a substrate 20 to the blade during transfer within the system 2.

Figure 2:
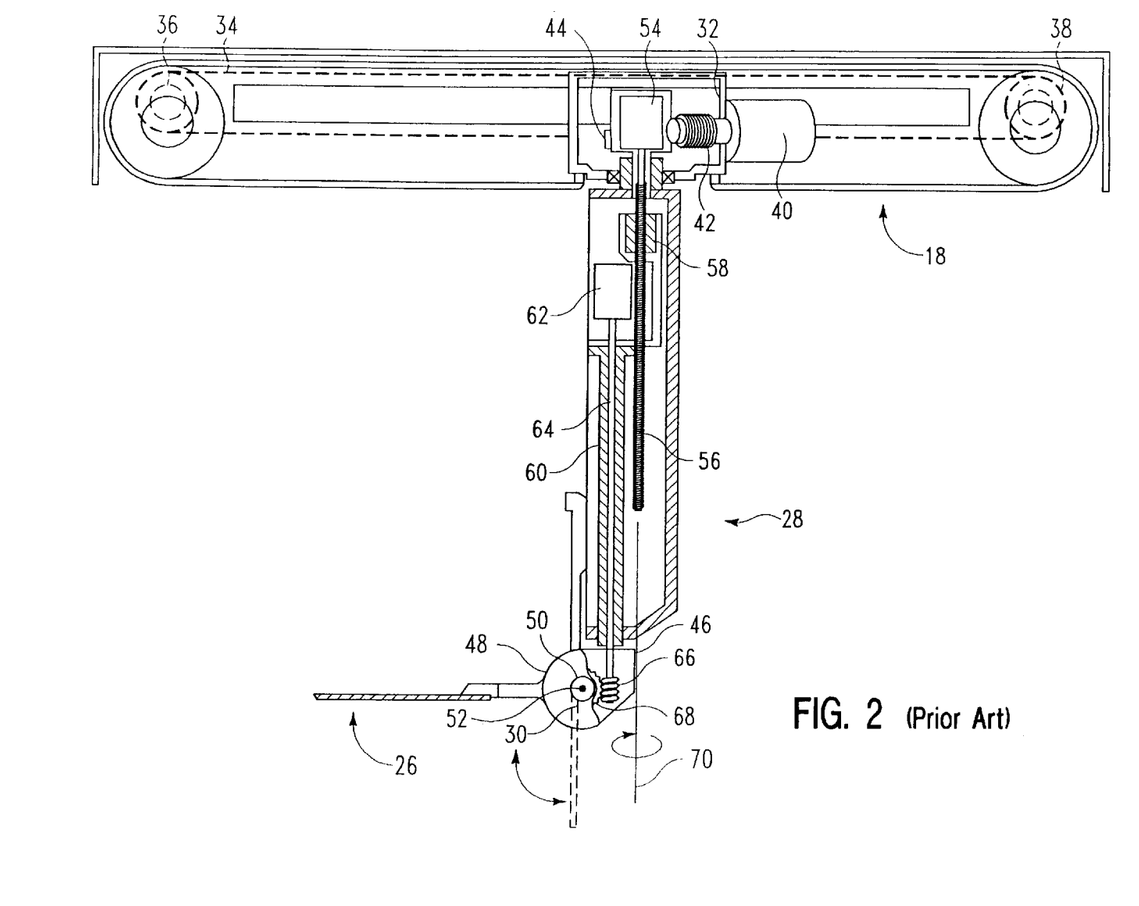
FIG. 2 is a schematic cross sectional view of a typical track robot having a blade support arm and a robot blade.

FIG. 2 is a cross sectional schematic view of the overhead track robot 18, showing details of the robot components. A blade support arm 28 is vertically disposed below a carriage 32. The carriage 32 is attached to a drive belt 34 which is supported between two sheaves 36, 38. A motor 40 having a worm gear 42 is mounted on the carriage 32 and engages a mating gear 44 mounted on the support arm 28. The blade support arm 28 supports a support column 60 that is connected to the pivot joint 30. The pivot joint 30 includes a first portion 46 connected to the blade support arm 28, a second portion 48 connected to a blade 26, and a pivot element 50 pivotally connecting the first portion 46 with the second portion 48 of the pivot joint 30. The pivot joint 30 allows the blade 26 to rotate at a pivot axis 52 between a horizontal and a vertical position. The blade 26 is a single-sided blade, i.e., the blade has one substrate supporting surface that is used to support the substrate during retrieval and delivery of a substrate 20 from and to the various stations. The carriage 32 houses a motor 54 having a worm gear 56 which passes through a worm nut 58 attached to the support column 60. The blade support arm 28 houses a motor 62 which is attached to a drive shaft 64 and a worm gear 66. The worm gear 66 engages a mating gear 68 on the pivot joint 30. The blade 26 is attached by screws (not shown) to the pivot joint 30.

The blade support arm 28 rotates about the Z-axis 70 when the motor 40 rotates the worm gear 42 which in turn rotates the mating gear 44 connected to the blade support arm. In the typical system, the pivot axis 52 is offset from the Z-axis 70 to enable use of a shorter blade 26 and consequently reduce blade deflection when extended horizontally in the system 2 on delivery and retrieval of a substrate 20. The worm nut 58 rises and lowers on the worm gear 56 as the motor 54 rotates the worm gear 56, thus raising and lowering the support column 60 attached thereto. To rotate the pivot joint 30 about the pivot axis 52, the motor 62 rotates the drive shaft 64 which causes the worm gear 66 to rotate. Rotation of the worm gear 66 causes the mating gear 68 to rotate, thus rotating the second portion 48 of the pivot joint 30 and the blade 26 attached thereto.

Typically, in loading the substrate 20 into the system 2, the robot 18 rotates the blade 26 into a vertical position, aligns the blade 26 with the substrate, lowers the blade 26 into an adjacent position with the substrate 20, and vacuum chucks a substrate 20 on a substrate supporting surface of the blade 26. A vacuum provided to a port on the blade supplies a vacuum to hold the substrate 20 to the supporting surface of the blade 26 so that when the blade is raised vertically, the substrate remains supported by the blade in the vertical position. The robot 18 then rotates the blade 26 about the pivot joint 30 into a substantially horizontal position, moves in the X-direction toward the loading station 4 rotates the blade about the Z-axis 70, aligns the blade with a loading station 4, and delivers the substrate to the loading station. The loading station pedestal 16 raises to engage the substrate 20 and lowers the substrate below the blade 26 so that the blade 26 can retract out of the loading station 4. One of the heads 12 indexes above the pedestal 16, the pedestal 16 raises the substrate 20 into contact with the head, the head chucks the substrate and indexes to a polishing station 6 for processing. After processing at the station(s), the substrate 20 is returned to the loading station 4. The robot 18 aligns the robot blade 26 with the loading station 4 to retrieve the processed substrate, retrieves the processed substrate, traverses the X-axis back into an unloading position at the load tank 24, and returns the substrate 20 to the load tank 24. The robot then loads another unprocessed substrate and delivers the substrate to the loading station 4.

One problem with this conventional design and process is that the system may sit idle while awaiting retrieval of an unprocessed substrate following removal of a processed substrate. The time required for the robot to cycle between a processed substrate and an unprocessed substrate is typically referred to as the "swap" time. In the system referenced in FIG. 1, the swap time includes the time required to retrieve and place a processed substrate in the load tank and retrieve and deliver an unprocessed substrate to the loading station.

There remains a need for a system and method that can reduce the swap time required to pick up a processed substrate and position an unprocessed substrate for processing in the system.

SUMMARY OF THE INVENTION

The present invention generally provides a processing system having a robot assembly which includes a multiple sided robot blade that can support a substrate on at least two sides thereof and associated methods to transfer one or more substrates in a processing system. An unprocessed substrate can be supported on the blade while a processed substrate is retrieved from a location to which the unprocessed substrate is to be delivered. The processing throughput rate is increased by reducing the movements required by the robot to exchange processed substrates and unprocessed substrates, thus decreasing the swap time.

In one aspect, the invention provides a substrate processing system, comprising an enclosure, a robot as least partially disposed within the enclosure, and a multiple sided robot blade attached to the robot and adapted to support substrates on at least two surfaces thereof. The robot can include a blade support arm connected to a drive mechanism, a pivot joint connected to the blade support arm, a two sided blade connected to the pivot joint, and associated actuators and controllers. In another aspect, the invention provides a robot blade for a substrate processing system, comprising a first and a second substrate supporting surface on opposed faces of the blade.

In another aspect, the invention provides a method for transferring substrates in a processing system, comprising supporting a first substrate on a first substrate supporting surface of a robot blade, retrieving a second substrate on a second substrate supporting surface of the robot blade from the system, and delivering the first substrate supported on the first substrate supporting surface to the system while supporting the second substrate on the second substrate supporting surface. In another aspect, the invention provides a method of transferring substrates in a processing system using a robot, comprising retrieving a first substrate from a first location and supporting the first substrate on a first substrate supporting surface of a robot blade, positioning the robot blade to retrieve a second substrate from a second location, retrieving the second substrate from the second location and supporting the second substrate on a second substrate supporting surface of the blade, delivering the first substrate to the second location, and delivering the second substrate to another location in the system.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4b is a schematic bottom view of the robot blade of FIG. 4a.

FIG. 4e is a schematic side view of the robot blade of FIG. 4a.

DETAILED DESCRIPTION OF THE PREFERRED EMBODIMENT

The present invention generally provides a processing system having a robot assembly with a multiple sided robot blade that can support a plurality of substrates on at least two sides thereof. In general, the system includes an enclosure, such as a CMP system 2, and a robot, such as an overhead track robot 72 shown in FIG. 3. The system may also include a loading station 4 adjacent a plurality of polishing stations 6. The loading station 4 is supplied with substrates by an overhead track robot 72 disposed in a substrate transfer region 14 above a load tank 24 having a plurality of cassette(s) 22.

Figure 3:
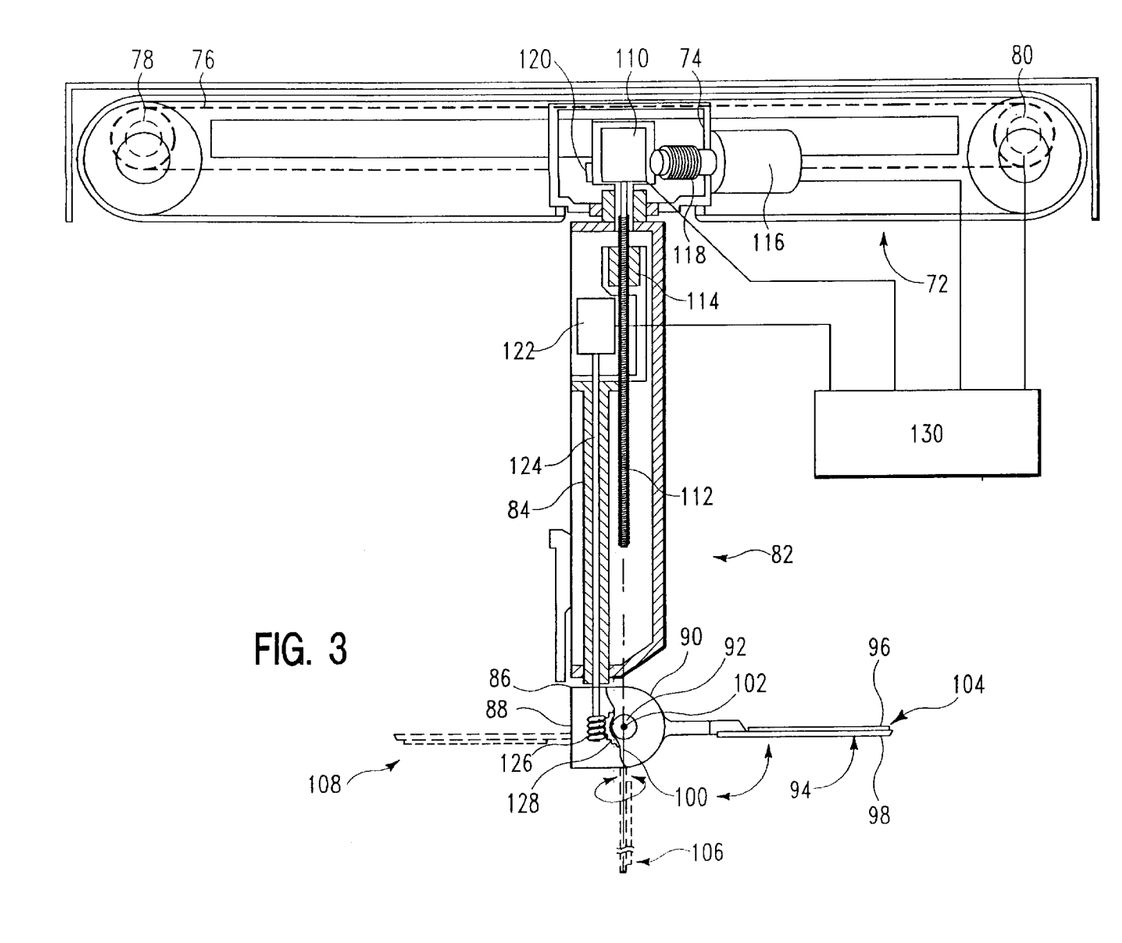
FIG. 3 is a schematic cross sectional view of one embodiment of the robot of the present invention.

FIG. 3 is a schematic cross sectional view of one embodiment of the robot 72 of the system. A carriage 74 is attached to the drive belt 76 which is supported between two sheaves 78, 80. A blade support arm 82 is connected to the carriage 74 and is vertically disposed below the carriage 74. The blade support arm 82 supports a support column 84 that is connected to a pivot joint 86. The pivot joint 86 includes a first portion 88 connected to the blade support arm 82, a second portion 90 connected to a multiple-sided robot blade 94, and a pivot element 92 pivotally connecting the first portion 88 with the second portion 90 of the pivot joint 86. The robot blade 94 includes at least two substrate supporting surfaces 96, 98 to support one or more substrates. Preferably, the blade support arm 82 can rotate at least 180° around a first axis 100 to assist the blade in moving from a first location to a second location. The pivot joint 86 having a pivot axis 102 allows the blade 94 to rotate at least 180° from a first horizontal position 104 as shown through a vertical position 106 to at least a second horizontal position 108. The carriage 74 houses a motor 110 having a worm drive 112 which passes through a worm nut 114 attached to the support column 84. The carriage 74 is connected to a motor 116 having a worm gear 118. The worm gear 118 is engaged with a mating gear 120 that is connected to the blade support arm 82. The blade support arm 82 houses a motor 122 which is attached to a drive shaft 124 and a worm gear 126. The worm gear 126 engages a mating gear 128 coupled to the second portion 90 of the pivot joint 86.

The blade support arm 82 rotates about a first axis 100 when the motor 116 rotates the worm gear 118 which in turn rotates the mating gear 120 connected to the blade support arm 82. The motor 110 rotates the worm gear 112 to raise and lower the support column 84. The worm nut 114 rises and lowers on the worm gear 112, thus raising and lowering the support column 84 attached thereto. To rotate the pivot joint 86 about the pivot axis 102, the motor 122 rotates the drive shaft 124 which rotates the worm gear 126. The worm gear 126 rotates the mating gear 128 that is coupled to the second portion 90 of the pivot joint 86 and the blade 94 connected thereto.

In the embodiment shown in FIG. 3, the vertical first axis 100 is substantially aligned in a transverse direction with the horizontal pivot axis 102, so that the first axis substantially intersects the pivot axis. The intersection of axes allows the first substrate supporting surface 96 to be symmetrically aligned with the second substrate supporting surface 98 when the blade 94 is rotated about the first axis 100 and about the pivot axis 102. For example, in the embodiment described in FIG. 3, the first substrate supporting surface 96 is disposed upwardly and the second substrate supporting surface 98 is disposed downwardly at position 104. The blade 94 can be rotated at least 180° about the pivot axis 102 through a vertical position 106 to a second horizontal position 108, where the first substrate supporting surface 96 is downwardly disposed and the second substrate supporting surface 98 is upwardly disposed. The blade 94 can also be rotated at least 180° about the first axis 100, so that the blade 94 returns to position 104, but this time the first substrate supporting surface 96 is downwardly disposed and the second substrate supporting surface 98 is upwardly disposed, in contrast to the original relative positions. Thus, the blade 94 can rotate about both axes 100, 102 and preserve the symmetry between substrate positions of the first and the second substrate supporting surfaces 96, 98. The substantial intersection of the two axes 100, 102 should be at least enough so that upon repositioning a second substrate to the position of a first substrate, enough symmetry is maintained to satisfy normal manufacturing and placement tolerances of the equipment for interchangeable placement of the substrates. In some embodiments, where the axes are not aligned, the robot 72 could compensate for the relative difference by, for instance, programming a controller 130 for positional relative movements.

Figure 4A:
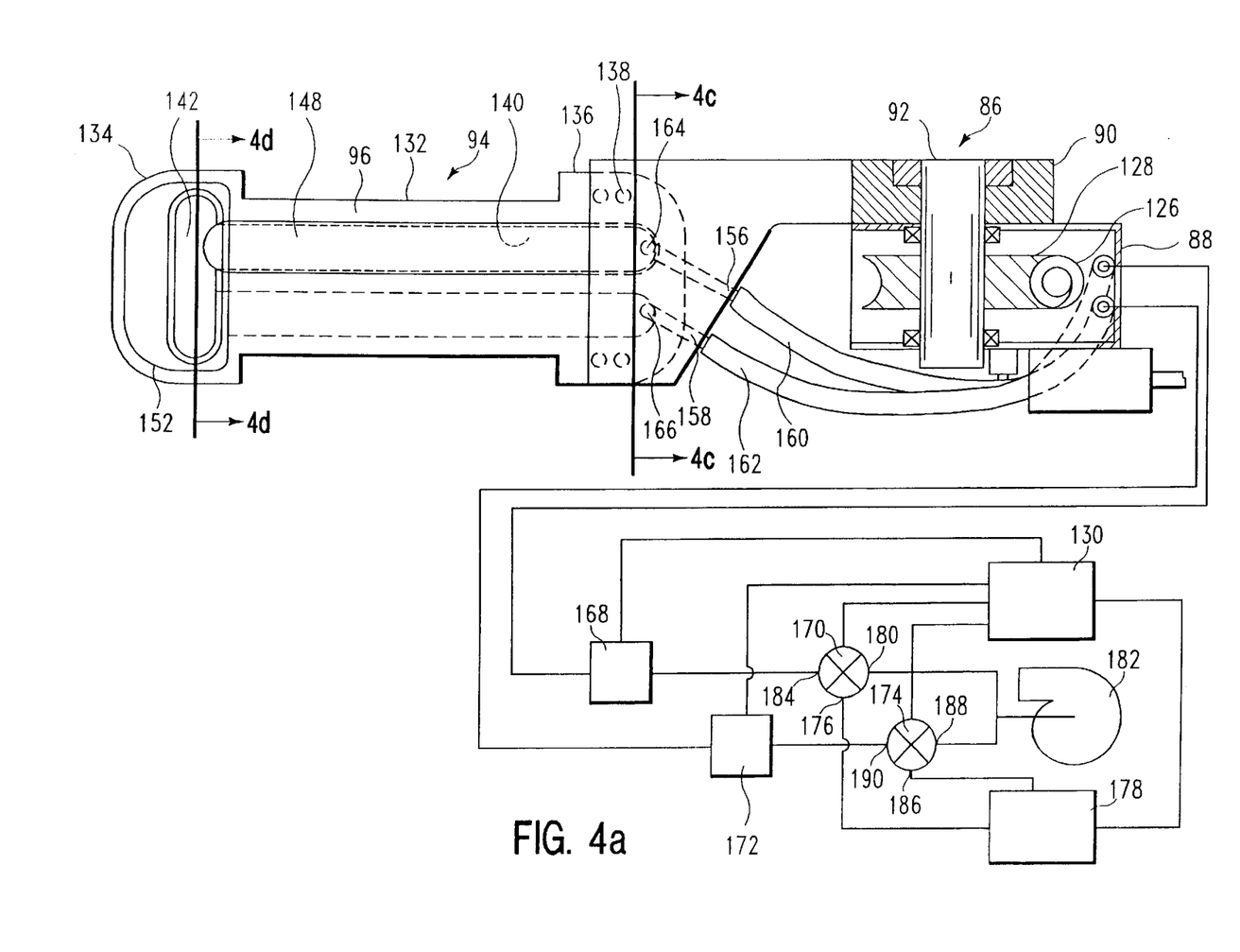
FIG. 4a is a schematic top view of one embodiment of the robot blade.

The blade 94 will now be described in reference to FIGS. 4a and 4b. FIG. 4a is a schematic top view of the blade 94.

Figure 4B:
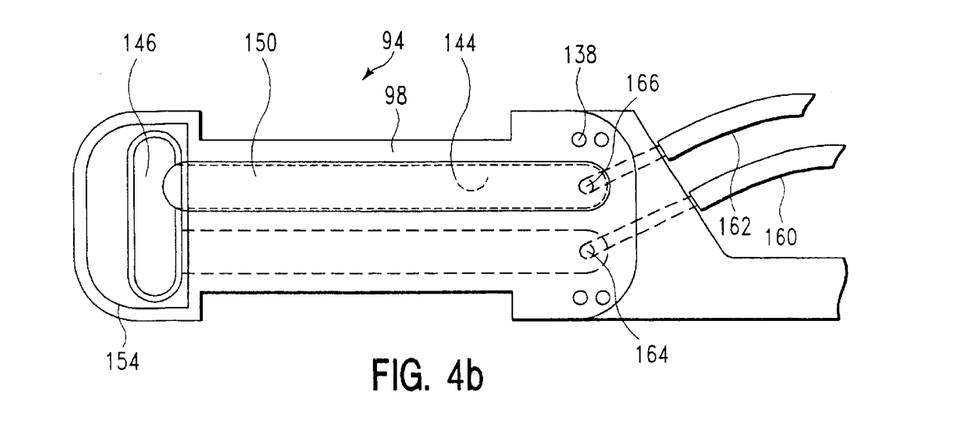

FIG. 4b is a schematic bottom view of the blade 94, showing similar components as the top view of the blade. The blade 94 is an elongated thin member, preferably made of stainless steel, having a first substrate supporting surface 96 and a second substrate supporting surface 98. The blade 94 can be made of other materials, such as alumina, silicon carbide, or other ceramics or combinations thereof. The blade 94 can have an intermediate section 132 between two end sections 134, 136 that is narrower in width than the two end sections. The blade 94 is attached to the pivot joint 86 by screws (not shown) disposed through holes 138. The first substrate supporting surface 96 defines a longitudinal channel 140 aligned along the length of the blade 94 and a transverse channel 142, where the longitudinal channel 140 intersects the transverse channel 142. Similarly, the second substrate supporting surface 98 defines a longitudinal channel 144 and a transverse channel 146, where the longitudinal channel 144 intersects the transverse channel 146. The longitudinal channel 140 and transverse channel 142 on the first substrate supporting surface 96 are isolated from the longitudinal channel 144 and transverse channel 146 on the second substrate supporting surface 98. The channels 140, 142, 144, 146 can be any shape and size as needed to support the particular substrate in the particular process. Each longitudinal channel 140, 144 is sealably covered by covers 148, 150 respectively, to allow the longitudinal channels to sealably communicate with the transverse channels. Gaskets 152, 154 are affixed to the blade 94 in proximity to the transverse channels 142, 146 to assist is sealing between the substrate and the respective substrate supporting surface when the substrate is supported by the substrate supporting surface through, for example, a vacuum applied to the channels.

The second portion 90 of the pivot joint 86 preferably has at least two independent ports 156, 158 that are connected to one end of hoses 160, 162, respectively. The port 156 is coupled to a port 164 on the blade 94 which fluidicly communicates with the channel 140. Similarly, port 158 is coupled to port 166 on the blade 94 which fluidicly communicates with the channel 144. Another end of the hose 160 is directed past the pivot joint 86 and then upward along the blade support arm 82 to pressure sensor 168 and to valve 170. Similarly, another end of the hose 162 is directed past the pivot joint 86 and then upward along the blade support arm 82 to pressure sensor 172 and to valve 174. The valves 170, 174 can be mounted on the robot 72 and controlled by controller 130. The valves 170, 174 are preferably three-way valves having three ports. On valve 170, a first port 176 is connected to a pressure source 178, the second port 180 is connected to a vacuum source 182, and the third port 184 is fluidicly connected to the sensor 168 and the hose 160. Similarly, on valve 174, a first port 186 is connected to the pressure source 178, the second port 188 is connected to the vacuum source 182, and the third port 190 is fluidicly connected to the sensor 172 and the hose 162.

The ports 164, 166 allow the independent placement of at least two substrates. In other embodiments, a single port, or multiple ports coupled together, could be used so that when one substrate was released on one side, the other substrate on the other side would be released from the vacuum. For instance, in an upright position, a substrate on top of the blade 94 could rely on gravity to remain substantially stationary while a substrate underneath the blade was unloaded, such as a loading station, and then reapply the vacuum to the blade 94 to support the substrate remaining on the blade.

Figure 4C:
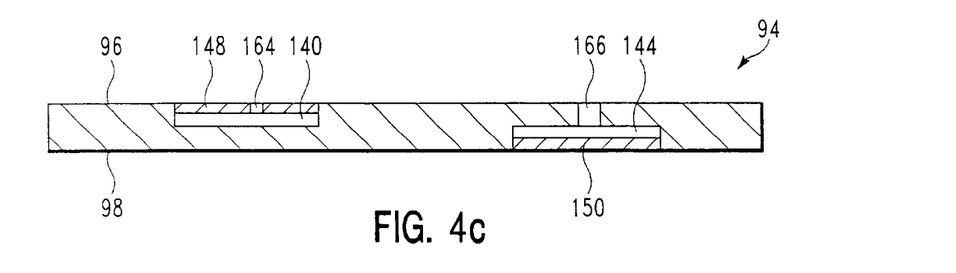
FIG. 4c is a schematic cross sectional view of FIG. 4a through the blade showing the longitudinal channels.

FIG. 4c is a schematic cross sectional view through the blade, showing the longitudinal channels referenced in FIG.

4a. Substrate supporting surface 96 includes the longitudinal channel 140 aligned longitudinally to the length of the blade. The longitudinal channel is preferably pneumatically sealed with a cover 148. The cover 148 can be attached to the blade 94 preferably by welding, such as electron beam welding, or it can be fastened, adhesively attached or otherwise connected. Substrate supporting surface 98 is similarly arranged and the longitudinal channel 144 is preferably pneumatically sealed with a cover 150. The port 164 is disposed through the cover 148 and fluidicly connected to the channel 140. Likewise, port 166 is disposed through the blade 94 and fluidicly connected to the channel 144.

The cross sectional area of the channels 140, 144 is preferably about the same as the cross sectional area of the hoses 160, 162. Furthermore, the channels 140, 144 preferably have a width (W) to height (H) ratio of less than about 38:1 and more preferably a W:H ratio of about 21:1 or less.

Figure 4D:
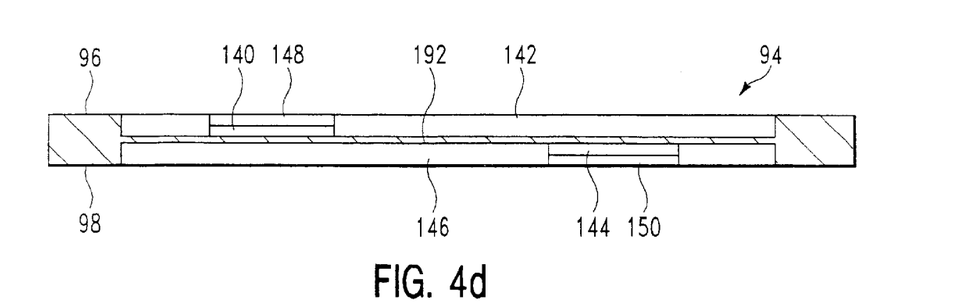
FIG. 4d is a schematic cross sectional view of FIG. 4a through the blade showing the transverse channels.

FIG. 4d is a schematic cross sectional view through the blade, showing the transverse channels 142, 146 referenced in FIG. 4a. On the substrate supporting surface 96, the longitudinal channel 140 is fluidicly connected to the transverse channel 142. On substrate supporting surface 98, the longitudinal channel 144 is fluidicly connected to the transverse channel 146. A blade web 192 isolates the longitudinal channel 140 and transverse channel 142 from the longitudinal channel 144 and transverse channel 146. The isolation of the channels allows independent control over each substrate (not shown) held to each substrate supporting surface 96, 98.

Figure 4E:
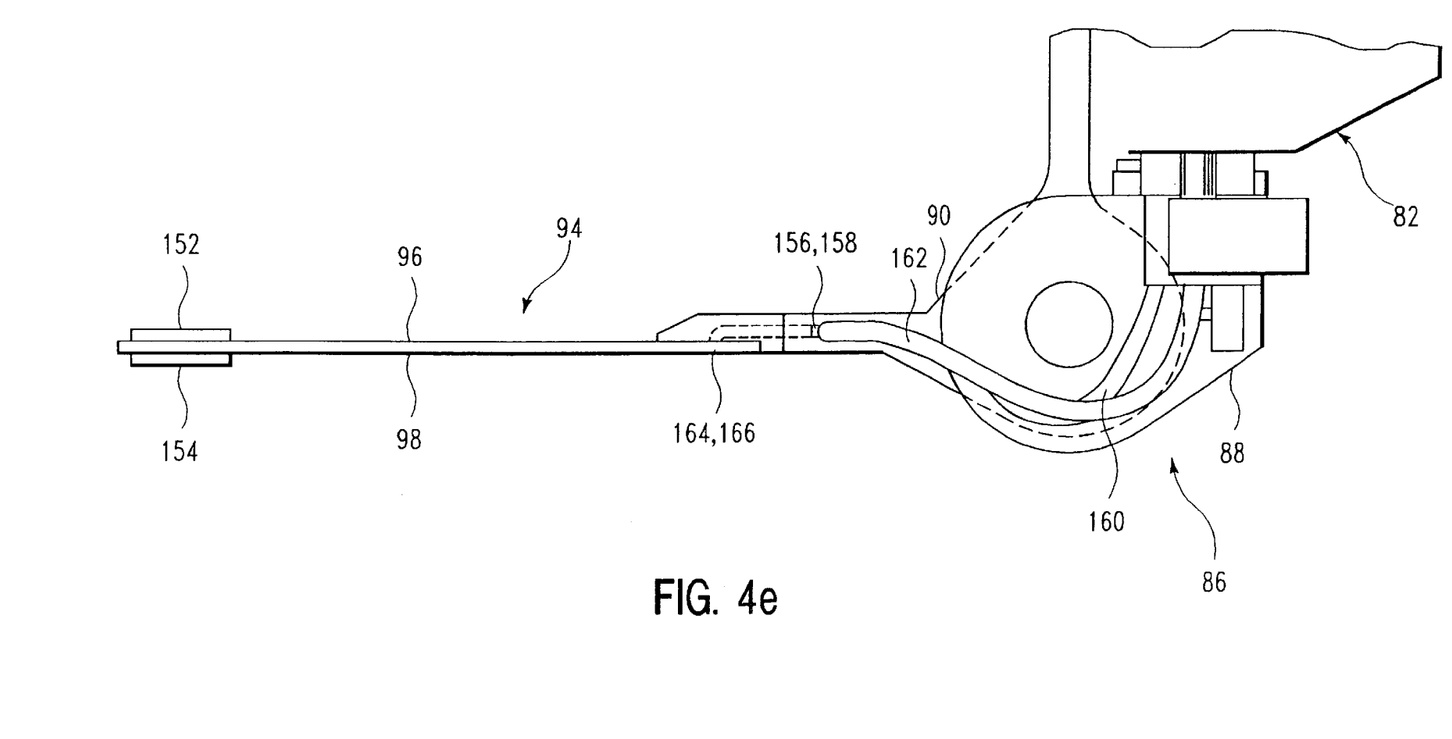

FIG. 4e is a side view of the blade 94 attached to the pivot joint 86. Hose 160 is coupled to port 156 and hose 162 is coupled to port 158. The port 156 is coupled to port 164 on the blade 94 and the port 158 is coupled to the port 166 on the blade 94, where each of the ports are upwardly disposed on the blade 94. Gaskets 152, 154 are disposed toward the end of the blade 94.

Other methods of supporting substrates on the blade can be used, such as electrostatic chucks, adhesive substances such as polymers, and mechanical devices such as "grippers" and other clamps. Also, multiple ports or other methods of support could be used on one substrate supporting surface. For instance, if more than one substrate were supported on one substrate supporting surface, then each substrate could be supported and released independently on that substrate supporting surface.

A controller 130, shown in FIGS. 3 and 4a, controls the functions of the robot movement, rotation and linear actuators, power supplies, and other associated components and functions. In general, the controller 130 preferably comprises a programmable microprocessor and executes system control software stored in a memory, which in the preferred embodiment is a hard disk drive, and can include analog and digital input/output boards, interface boards, and stepper motor controller boards (not shown). The controller 130 controls electrical power to the components of the system and includes a panel that allows an operator to monitor and operate the system. Optical and/or magnetic sensors (not shown) are generally used to move and determine the position of movable mechanical assemblies. The controller 130 also controls a pressure and a vacuum system, such as pressure source 178, vacuum source 182, and valves 170, 174. A vacuum can be supplied through the hoses 160, 162 to the blade 94 when the blade is lowered into the load tank 24 and allows the blade to retrieve and support the substrate 20. The particular sensor, either sensor 168 or sensor 172, coupled to the surface of the blade supporting the substrate 20 senses a change in vacuum performance with the substrate on the particular surface. The surface of the blade 94 not supporting a substrate 20 is exposed to the fluid in the load tank 24 and can entrain some fluid into the channel from that surface. The sensor for the respective surface with the entrained load tank fluid senses no substrate on that surface and switches the respective valve from the valve second port which allows vacuum to the respective port on the blade to the valve first port which allows pressurized fluid to the respective port on the blade. The pressurized fluid flows outward through the channel on the substrate supporting surface not supporting the substrate to purge the channel of the load tank fluid, thus creating a purge mode, while the port to the substrate supporting surface supporting the substrate maintains vacuum on the substrate. Preferably, the controller 130 defaults to a purge mode except when the particular surface(s) is supporting the substrate(s).

Figure 5:
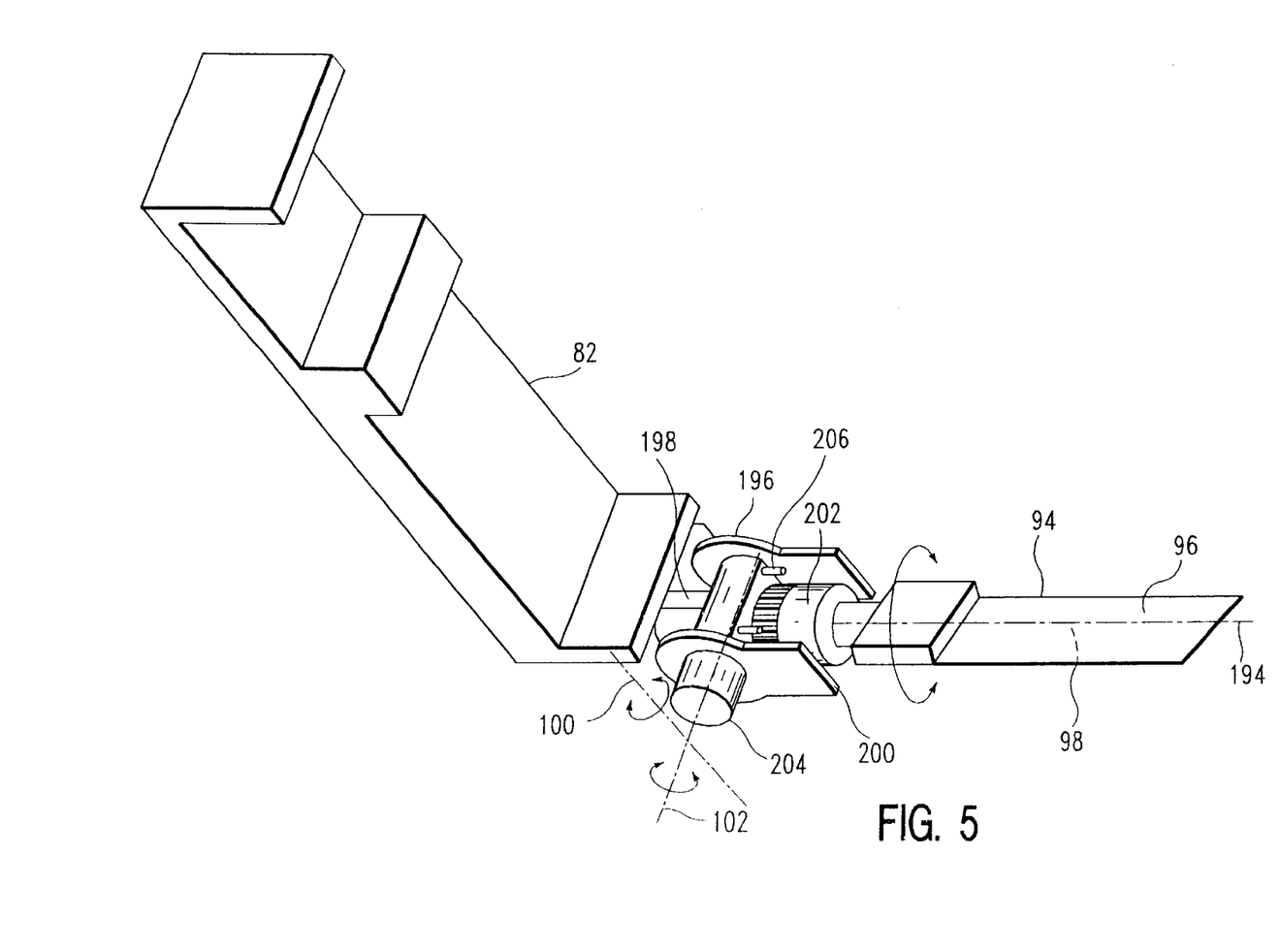
FIG. 5 is a schematic cross sectional view of another embodiment of the robot of the present invention.

FIG. 5 is a schematic perspective view of another embodiment of the robot including the multiple sided blade 94 and associated components. In this embodiment, the robot blade is able to rotate about a blade axis 194 in addition to being able to rotate about the first axis 100 and the pivot axis 102, described herein. The pivot joint 196 includes a first portion 198 connected to the blade support arm 82, a second portion 200 connected to a rotatable actuator 202, and a pivot element 204 pivotally connecting the first portion 198 with the second portion 200 of the pivot joint 196. The rotatable actuator 202 is coupled to the blade 94 and can rotate the blade about the blade axis 194. The actuator 202, such as a servomotor, preferably directly drives the rotation of the blade 94. The actuator 202 could have the typical pneumatic lines if pneumatic actuation is used. The controller 130, referenced in FIG. 3, can also be used to control the actuator. A sensor 206, such as an optical sensor, may be coupled to the actuator 202 to determine the position of the blade 94 and provide input to the controller 130. The pivot joint 196 allows the blade 94 to rotate at the pivot axis 102. The blade support arm 82 can also rotate about 180° around the first axis 100.

The actuator 202 can rotate the blade 94 about the blade axis 194 to selectively position the first substrate supporting surface 96 and the second substrate supporting surface 98 in a face up or face down position. In the embodiment shown, the pivot joint 196 could be rotated about 90° from a substantially vertical position to a substantially horizontal position to retrieve and deliver the substrate 20 from the load tank 24 and the loading station 4, referenced in FIG. 1. Because the actuator 202 can rotate the blade 94 with a first and second substrate supporting surfaces between face up and face down positions, the pivot axis 102 need not be aligned with the first axis 100 nor does the pivot joint 196 need to rotate about the pivot axis 102 through at least 180°.

Figure 6:
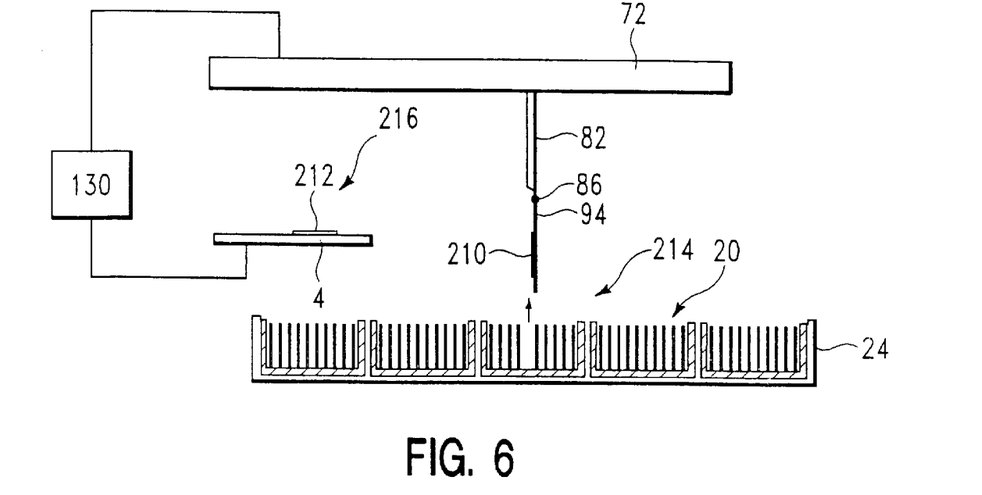
FIG. 6 is a schematic side view of the robot with the blade in a vertical position with a first substrate over a first location.

FIGS. 6–12 show schematic side views of an operational sequence for transferring a first substrate 210 and second substrate 212 between a first location 214 and a second location 216 in a CMP system. FIG. 6 is a schematic side view of the robot 72 with the blade 94 in a vertical position over the load tank 24. In operation, a controller 130 determines that the loading station 4 needs or will need a substrate, for instance, by using a sensor or timer (not shown) to determine that a substrate has been processed or will be processed. The controller 130 activates the robot 72 to rotate the blade 94 about the pivot joint 86 to a substantially vertical position to retrieve a first substrate 210 from the load tank 24. The first substrate 210 is held on the blade 94 by, for example, a vacuum source. The blade support arm 82 raises the blade 94 and substrate supported thereon in a vertical direction to clear the load tank 24. The blade 94 is then moved into a horizontal position.

Figure 7:
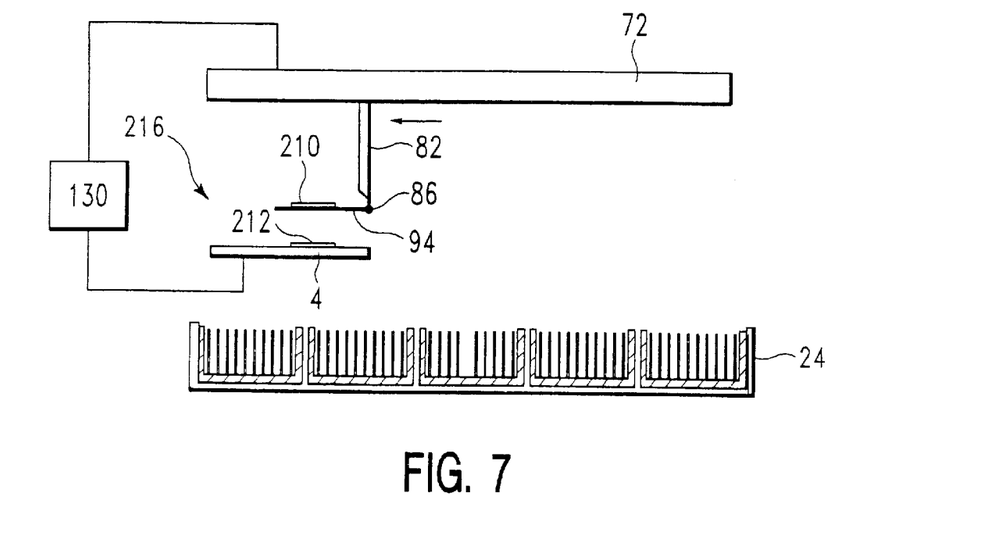
FIG. 7 is a schematic side view of the robot with the blade rotated to a substantially horizontal position with a first substrate.

FIG. 7 is a schematic side view of the robot 72 with the blade 94 supporting a first substrate 210 rotated to a substantially horizontal position. The blade 94 has been rotated about the pivot joint 86 by about 90° from the position referenced in FIG. 6. Also, the robot 72 has moved the blade support arm 82 and blade 94 to a position over a second substrate 212 disposed in the loading station 4. The second substrate 212 is positioned adjacent the lower surface of the blade and chucked thereto. The robot 72 then retracts from the loading station as shown in FIG. 8.

Figure 8:
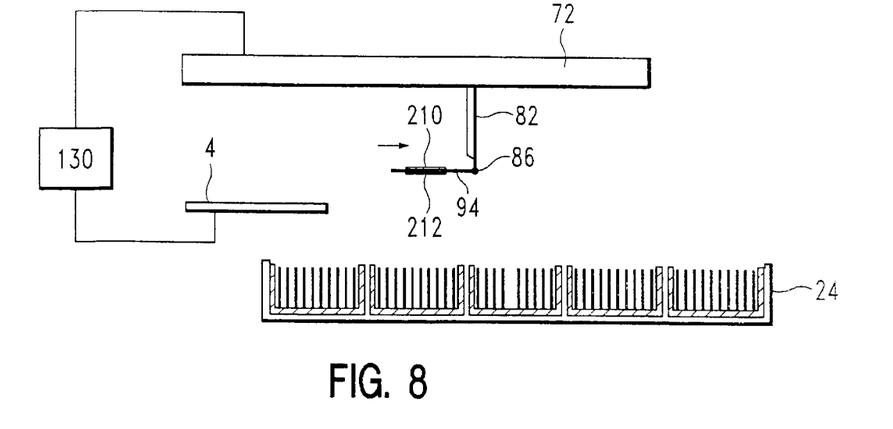
FIG. 8 is a schematic side view of the robot with the blade supporting the first and second substrates on the first and second substrate supporting surfaces, respectively.

FIG. 8 is a schematic side view of the robot 72 with the blade 94 supporting the first and second substrates on the first and second substrate supporting surfaces, respectively. In this embodiment, both substrate supporting surfaces of the blade 94 are used to support the substrates 210, 212 by a vacuum, although other techniques of holding the substrates in place known in the art, such as mechanical grippers and adhesive films, can be used. In this view, the first substrate 210 is disposed in a top position on the blade 94 and the second substrate 212 is disposed in a bottom position on the blade 94.

Figure 9:
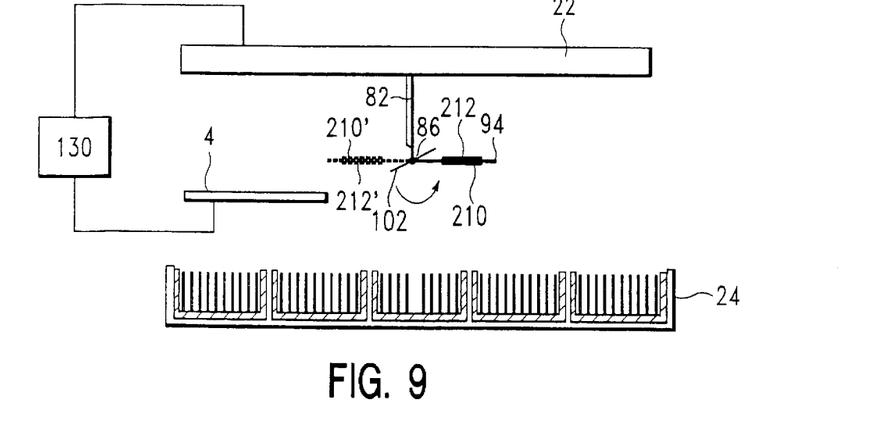
FIG. 9 is a schematic side view of the robot with the blade rotated about a pivot joint from the position referenced in FIG. 8.
Figure 10:
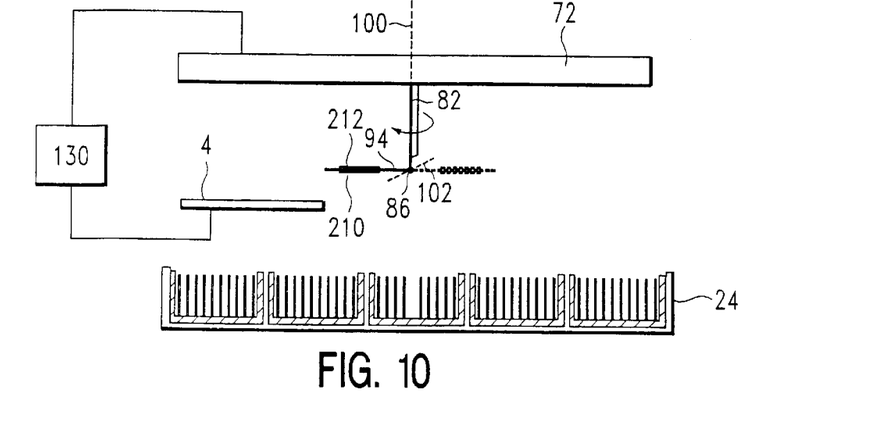
FIG. 10 is a schematic side view of the robot with the blade rotated about a first axis.

The blade 94 is then rotated 180° about the pivot joint 86 and its axis 102 as shown in FIG. 9. As a result of the rotation, the two substrates are "flipped" so that the first substrate 210, which was at the top position 210' of the blade 94, is relocated to the bottom of the blade. Similarly, the second substrate 212, which was at the bottom position 212', is relocated to the top of the blade 94. The blade 94 is then rotated 180° about a first axis 100 to position the blade for re-entry into the loading station 4, as shown in FIG. 10.

Figure 11:
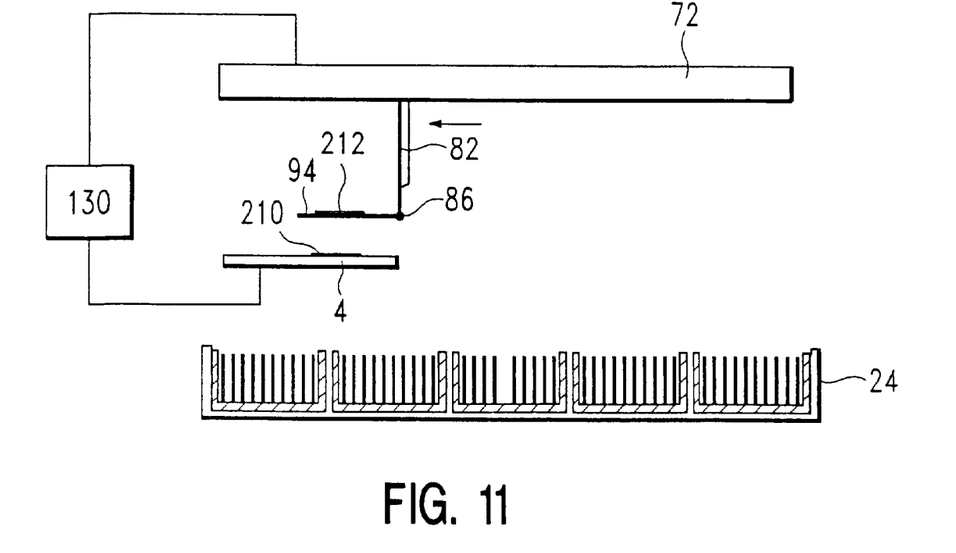
FIG. 11 is a schematic side view of the robot with the blade having unloaded the first substrate into a second location while supporting the second substrate.

The blade 94 then moves to the loading station 4 and the first substrate 210 is unloaded into the loading station 4, as shown in FIG. 11. The second substrate 212 remains supported on the blade.

Figure 12:
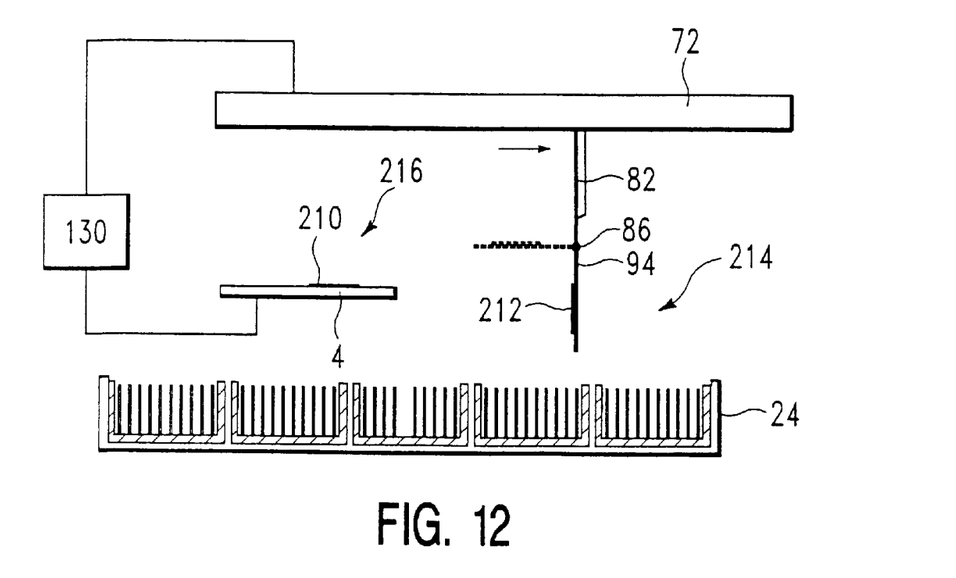
FIG. 12 is a schematic side view of the robot with the blade in a vertical position with a second substrate over the first location.

The blade 94 is then moved from a horizontal position to a vertical position to align the second substrate 212 over an open position in the load tank 24 as shown in FIG. 12. Alternatively, the second substrate 212 could be moved to an inspection device and another substrate retrieved from the inspection device and loaded into the loading tank 24. A substrate purge sequence could be performed at the inspection station as well.

Variations in the orientation of the blade, substrates, robot, robot support arm, loading stations, and other system components are possible. Additionally, all movements and positions, such as "above", "top", "below", "bottom", "side", described herein are relative to positions of objects such as the robot blade, the substrates, and the first and second locations. Accordingly, it is contemplated by the present invention to orient any or all of the components to achieve the desired movement of substrates through a processing system.

While foregoing is directed to the preferred embodiment of the present invention, other and further embodiments of the invention may be devised without departing from the basic scope thereof, and the scope thereof is determined by the claims that follow.

What is claimed is:

1. A method for transferring substrates in a system, comprising:
   a) retrieving a first substrate with a robot blade:
   b) supporting the first substrate on a first substrate supporting surface of the robot blade, wherein a primary orientation of the first substrate is in a first plane;
   c) retrieving a second substrate on a second substrate supporting surface of the robot blade, wherein a primary orientation of the second substrate is in one of the first or a second plane, the second plane being substantially perpendicular to the first plane; and
   d) delivering one of the substrates supported on one of the substrate supporting surfaces while supporting the other substrate on the other substrate supporting surface, wherein at least one of the first or second substrates is rotated to a secondary orientation between retrieval and delivery, the secondary orientation being substantially perpendicular to the primary orientation of the at least one substrate.

2. The method of claim 1, further comprising rotating the robot blade while supporting the substrate on the first substrate supporting surface prior to supporting the second substrate on the second substrate supporting surface.

3. The method of claim 1, further comprising rotating the blade about a first axis on the robot about 180° and rotating the blade about a pivot axis on a pivot joint about 180°.

4. The method of claim 1, wherein the first substrate has a first position and further comprising aligning the second substrate with the first position when the robot blade has been rotated about 180° about a first axis and rotated about 180° about a pivot axis.

5. The method of claim 1, further comprising symmetrically positioning a second substrate supporting surface to a position of the first substrate supporting surface.

6. The method of claim 3, wherein a position of the first substrate on the first substrate supporting surface is substantially the same as a position of the second substrate when the blade has been rotated about 180° in the two axes.

7. The method of claim 1, wherein each substrate supporting surface is in communication with a vacuum source.

8. A method of transferring substrates within a system using a robot, comprising:
   a) retrieving a first substrate from a first location, wherein a primary orientation of the first substrate is in a first plane;
   b) supporting the first substrate on a first substrate supporting surface of a robot blade;
   c) positioning the robot blade to retrieve a second substrate from a second location;
   d) retrieving the second substrate from the second location, wherein a primary orientation of the second substrate is in one of the first or a second plane, the second plane being substantially perpendicular to the first plane;
   e) supporting the second substrate on a second substrate supporting surface of the blade;
   f) delivering the first substrate to the second location; and
   g) delivering the second substrate to another location in the system,
   wherein at least one of the first or second substrates is rotated to a secondary orientation between retrieval and delivery, the secondary orientation being substantially perpendicular to the primary orientation of the at least one substrate.

9. The method of claim 8, wherein delivering the second substrate comprises delivering the second substrate at the first location.

10. The method of claim 8, wherein positioning the robot blade to retrieve the second substrate from the second location comprises rotating the blade about a first axis.

11. The method of claim 8, wherein positioning the robot blade to retrieve the second substrate from the second location comprises rotating the blade about a pivot axis to align the blade to the second location.

12. The method of claim 8, wherein wherein positioning the robot blade to retrieve the second substrate from the second location comprises rotating the blade 180° degrees about a first axis and 180° degrees about a pivot axis to align the blade to the second location.

13. The method of claim 8, further comprising communicating each substrate supporting surface supporting a substrate with a vacuum source.

14. A method for transferring substrates in a system, comprising:

a) supporting a first substrate on a first substrate supporting surface of a robot blade, wherein the blade is oriented in a first position and the first substrate supporting surface faces a first direction relative to a system reference point;

b) rotating the blade about a pivot axis so that a second substrate supporting surface of the blade faces the first direction, and the first substrate supporting surface faces a second direction opposite to the first; and c) rotating the blade about a longitudinal axis intersecting the pivot axis to align the second substrate supporting surface with the first position of the blade.

* * * * *